(12) United States Patent
Cho et al.

(10) Patent No.: US 9,437,746 B2
(45) Date of Patent: Sep. 6, 2016

(54) THIN FILM TRANSISTOR SUBSTRATE HAVING METAL OXIDE SEMICONDUCTOR AND METHOD FOR MANUFACTURING THE SAME

(71) Applicant: LG Display Co., Ltd., Seoul (KR)

(72) Inventors: Kisul Cho, Gumi-si (KR); Seongmoh Seo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/562,540

(22) Filed: Dec. 5, 2014

(65) Prior Publication Data

US 2015/0091006 A1    Apr. 2, 2015

Related U.S. Application Data

(62) Division of application No. 13/717,564, filed on Dec. 17, 2012, now Pat. No. 8,932,902.

(30) Foreign Application Priority Data

Jun. 26, 2012    (KR) ......................... 10-2012-0068440

(51) Int. Cl.
*H01L 29/12*    (2006.01)
*H01L 29/786*    (2006.01)
(Continued)

(52) U.S. Cl.
CPC ......... *H01L 29/7869* (2013.01); *G02F 1/1368* (2013.01); *G02F 1/133514* (2013.01); *G02F 1/134336* (2013.01); *G02F 1/134363* (2013.01); *G02F 1/136227* (2013.01); *G02F 1/136286* (2013.01); *H01L 23/53228* (2013.01); *H01L 23/53238* (2013.01); *H01L 27/124* (2013.01); *H01L 27/1225* (2013.01); *H01L 29/66742* (2013.01); *H01L 29/786* (2013.01);
(Continued)

(58) Field of Classification Search
CPC ......................... H01L 29/7869; H01L 29/786
USPC ............................ 257/43, 72, 288, E21.411
See application file for complete search history.

(56) References Cited

U.S. PATENT DOCUMENTS

2005/0140858 A1    6/2005    Park
2010/0291741 A1*   11/2010   Choi .................. H01L 27/1288
                                                                 438/158

(Continued)

FOREIGN PATENT DOCUMENTS

CN    101887868 A    11/2010
CN    102498570 A     6/2012
(Continued)

OTHER PUBLICATIONS

Korean Intellectual Property Office, Office Action, Korean Patent Application No. 10-2012-0068440, Mar. 25, 2014, five pages [with concise explanation of relevance].

(Continued)

*Primary Examiner* — Julia Slutsker
(74) *Attorney, Agent, or Firm* — Fenwick & West LLP

(57) ABSTRACT

The present disclosure relates to a thin film transistor substrate with a metal oxide semiconductor layer that has enhanced characteristics and stability. The present disclosure also relates to a method for manufacturing a thin film transistor substrate in which a thermal treatment is conducted for the metal oxide semiconductor layer and the damages to the substrate by the thermal treatment are minimized.

7 Claims, 7 Drawing Sheets

(51) Int. Cl.
*H01L 29/66* (2006.01)
*H01L 27/12* (2006.01)
*G02F 1/1343* (2006.01)
*G02F 1/1335* (2006.01)
*G02F 1/1362* (2006.01)
*G02F 1/1368* (2006.01)
*H01L 23/532* (2006.01)

(52) U.S. Cl.
CPC ............. *G02F2001/133519* (2013.01); *G02F 2001/134372* (2013.01); *G02F 2001/136222* (2013.01); *H01L 2924/0002* (2013.01)

(56) References Cited

U.S. PATENT DOCUMENTS

| | | | |
|---|---|---|---|
| 2011/0210355 A1* | 9/2011 | Yamazaki | H01L 27/1225 257/98 |
| 2011/0284852 A1* | 11/2011 | Kim | H01L 27/1225 257/59 |
| 2012/0113346 A1 | 5/2012 | Choi et al. | |
| 2012/0132903 A1 | 5/2012 | Yamazaki et al. | |

FOREIGN PATENT DOCUMENTS

| | | |
|---|---|---|
| KR | 10-2008-0048936 A | 6/2008 |
| KR | 10-1036723 B1 | 5/2011 |
| KR | 10-1134989 B1 | 4/2012 |

OTHER PUBLICATIONS

Taiwan Patent Office, First Office Action, Taiwan Patent Application No. 101145642, Sep. 22, 2014, six pages.

Chinese First Office Action, Chinese Application No. 201210566973.2, Jun. 3, 2015, 13 pages.

United States Office Action, U.S. Appl. No. 13/717,564, Jun. 27, 2014, 11 pages.

United States Office Action, U.S. Appl. No. 13/717,564, Jan. 29, 2014, 10 pages.

\* cited by examiner

THIN FILM TRANSISTOR SUBSTRATE HAVING METAL OXIDE SEMICONDUCTOR AND METHOD FOR MANUFACTURING THE SAME

CROSS-REFERENCE TO RELATED APPLICATIONS

This application is a divisional application of U.S. patent application Ser. No. 13/717,564 filed on Dec. 17, 2012, which claims priority to Republic of Korea Patent Application No. 10-2012-0068440 filed on Jun. 26, 2012, which are incorporated by reference herein in their entirety.

BACKGROUND OF THE INVENTION

1. Field of the Invention

The present disclosure relates to a thin film transistor substrate having a metal oxide semiconductor for flat panel display and a method for manufacturing the same. Especially, the present disclosure relates to a thin film transistor having a metal oxide semiconductor in which the stability of the channel layer is enhanced by the thermal treatment and a method for manufacturing the same.

2. Discussion of the Related Art

Nowadays, as the information society is developed, the requirements of displays for representing information are increasing. Accordingly, the various flat panel displays are developed for overcoming many drawbacks of the cathode ray tube such as heavy weight and bulk volume. The flat panel display devices include the liquid crystal display device (or LCD), the field emission display (or FED), the plasma display panel (or PDP), the electroluminescence device (or ED) and the electrophoretic display device (or EDD).

The display panel of a flat panel display may include a thin film transistor substrate having a thin film transistor allocated in each pixel area arrayed in a matrix manner. For example, the liquid crystal display device represents video data by controlling the light transmitivity of the liquid crystal layer using the electric fields. According to the direction of the electric field, the LCD can be classified in the two major types; one is vertical electric field type and the other is the horizontal electric field type.

For the vertical electric field type LCD, a common electrode formed on an upper substrate and a pixel electrode formed on a lower substrate are facing with each other for forming an electric field of which direction is perpendicular to the substrate face. A twisted nematic (TN) liquid crystal layer disposed between the upper substrate and the lower substrate is driven by the vertical electric field. The vertical electric field type LCD has merit of higher aperture ratio, while it has demerit of narrower view angle about 90 degree.

For the horizontal electric field type LCD, a common electrode and a pixel electrode are formed on the same substrate in parallel. A liquid crystal layer disposed between an upper substrate and a lower substrate is driven in In-Plane-Switching (IPS) mode by an electric field parallel to the substrate face. The horizontal electric field type LCD has a merit of wider view angle over 160 degrees and faster response speed than the vertical electric field type LCD. However, the horizontal electric field type LCD may have demerits such as low aperture ratio and transmitivity ratio of the back light. In the IPS mode LCD, for example, in order to form the in-plane electric field, the gap between the common electrode and the pixel electrode may be larger than the gap between the upper substrate and the lower substrate, and in order to get enough strength of the electric field, the common electrode and the pixel electrode may have a strip pattern having certain width. Between the pixel electrode and the common electrode of the IPS mode LCD, the electric field horizontal with the substrate is formed. However, just on the pixel electrode and the common electrode, there is no electric field. That is, the molecules disposed just over the pixel common electrodes are not driven but maintain the initial conditions (the initial alignment direction). As the liquid crystal in the initial condition cannot control the light transmitivity properly, the aperture ratio and the luminescence may be degraded.

For resolving these demerits of the IPS mode LCD, the fringe field switching (or FFS) type LCD driven by the fringe electric field has been proposed. The FFS type LCD comprises the common electrode and the pixel electrode with the insulating layer there-between, and the gap between the pixel electrode and the common electrode is set narrower than the gap between the upper substrate and the lower substrate. So that, a fringe electric field having a parabola shape is formed in the space between and on the common electrode and the pixel electrode. Therefore, liquid crystal molecules disposed between the upper substrate and the lower substrate can be driven by this fringe field. As a result, it is possible to enhance the aperture ratio and the front luminescence.

FIG. 1 is a plane view illustrating a thin film transistor substrate having an oxide semiconductor layer included in a fringe field type liquid crystal display according to the related art. FIG. 2 is a cross-sectional view illustrating the structure of the thin film transistor substrate of FIG. 1 by cutting along the line I-I' according to the related art.

The thin film transistor substrate shown in FIGS. 1 and 2 comprises a gate line GL and a data line DL crossing each other with a gate insulating layer GI therebetween on a lower substrate SUB, and a thin film transistor T formed at the crossing portion. By the crossing structure of the gate line GL and the data line DL, a pixel area is defined. In the pixel area, a pixel electrode PXL and a common electrode COM facing each other with a passivation layer PAS therebetween are disposed for forming the fringe field. For example, the pixel electrode PXL has a rectangular shape corresponding to the shape of the pixel area, and the common electrode COM has a plurality of strips disposed in parallel each other.

The common electrode COM is connected to a common line CL disposed in parallel with the gate line GL. A reference voltage (or common voltage) is supplied to the common electrode COM through the common line CL.

The thin film transistor T charges and maintains the pixel signal voltage to the pixel electrode PXL by responding to the gate signal of the gate line GL. To do so, the thin film transistor T comprises a gate electrode G branched from the gate line GL, a source electrode S branched from the data line DL, a drain electrode D facing the source electrode S and connecting to the pixel electrode PXL, and an active layer A overlapping with the gate electrode G on the gate insulating layer GI for forming a channel between the source electrode S and the drain electrode D. Between the active layer A and the source electrode S, and between the active layer A and the drain electrode D, there may be further the ohmic contact layers.

The active layer A is made of oxide semiconductor material, as it has high electron mobility characteristics so it is good for the large area thin film transistor substrate which requires larger charging capacitance. However, the oxide semiconductor materials are not developed for the electrical elements to have good characteristics with the stabilized conditions. Therefore, it is preferable to have an etch-stopper ES on the active layer A for protecting the oxide semiconductor material. For example, in the step for patterning the source electrode S and the drain electrode D by photo-lithography method, the active layer A can be protected from the etching material by forming the etch stopper ES between the source electrode S and the drain electrode.

At one end portion of the gate line GL, a gate pad GP is formed for receiving the gate signal from the external video device. The gate pad GP is connected to the gate pad terminal GPT through the gate pad contact hole GPH penetrating the gate insulating layer GI and the passivation layer PAS. Further, at one end portion of the data line DL, a data pad DP is formed for receiving the data signal from the external video device. The data pad DP is connected to the data pad terminal DPT through the data pad contact hole DPH penetrating the passivation layer PAS.

The pixel electrode PXL disposed on the gate insulating layer GI is connected to the drain electrode D. Further, the common electrode COM is formed to overlap with the pixel electrode PXL there-between the passivation layer PAS covering the pixel electrode PXL. The electric field can be formed between the pixel electrode PXL and the common electrode COM, and then the liquid crystal molecules horizontally disposed between the thin film transistor substrate and the color filter substrate can be rotated by the dielectric anisotropy. According to the rotating conditions of the liquid crystal molecules, the light transmitivity of the light through the pixel area can be controlled and the various gray scales can be represented.

Even though the thin film transistor substrate having the metal oxide semiconductor material may have many merits, the stability of the oxide semiconductor material is not ensured. Therefore, there are many obstacles for developing the electric elements using the oxide semiconductor material.

SUMMARY OF THE INVENTION

In order to overcome the above mentioned drawbacks, the purpose of the present disclosure is to suggest a thin film transistor substrate in which the metal oxide semiconductor layer has the enhanced characteristics and stability. Another purpose of the present disclosure is to suggest a method for manufacturing a thin film transistor substrate in which a thermal treatment is conducted for the metal oxide semiconductor layer and the damages to the substrate by the thermal treatment are minimized.

In order to accomplish the above purpose, one embodiment of the present disclosure suggests a thin film transistor substrate comprising: a gate electrode formed on a substrate; a gate insulating layer covering first portions of the gate electrode and exposing second portions of the gate electrode; a semiconductor active layer overlapping with the first portions of the gate electrode on the gate insulating layer; a gate line contacting the second portions of the gate electrode and running in a horizontal direction on the substrate; an intermediate insulating layer exposing middle portions of the semiconductor active layer and covering the gate line and the gate electrode; a data line running in a vertical direction on the substrate on the intermediate insulating layer; a source electrode branching from the data line and contacting one side of the semiconductor active layer; and a drain electrode facing the source electrode, separated from the source electrode by a predetermined distance, and contacting another side of the semiconductor active layer.

In some embodiments, the thin film transistor substrate further comprises: a passivation layer covering the source electrode and the drain electrode; a pixel contact hole exposing portions of the drain electrode by penetrating the passivation layer; and a pixel electrode contacting the drain electrode through the pixel contact hole.

In some embodiments, the thin film transistor substrate further comprises: a color filter layer disposed on the passivation layer and under the pixel electrode; and an overcoat layer disposed under the pixel electrode and covering the color filter layer.

In some embodiments, the color filter layer is filled with the inside area of a pixel area surrounded by the gate line and the data line, and is covering areas corresponding to the thin film transistor including the semiconductor active layer.

In some embodiments, the gate line includes a copper material.

In some embodiments, the data line includes a low resistance layer having copper and a protective layer having molybdenum.

In another embodiment, a manufacturing method of a thin film transistor substrate comprises: depositing a gate electrode metal material, a gate insulating material, and a metal oxide semiconductor material on a substrate; conducting a thermal treatment; forming a gate electrode, a gate insulating layer, and a semiconductor active layer by patterning the gate electrode metal material, the gate insulating material, and the metal oxide semiconductor material; forming a gate line contacting portions of the gate electrode and running in a horizontal direction on the substrate; forming an intermediate insulating layer covering the gate line and the gate electrode and exposing middle portions of the semiconductor active layer; and forming a data line running in a vertical direction on the intermediate insulating layer, a source electrode branching from the data line and contacting one side of the semiconductor active layer, and a drain electrode facing the source electrode, separated from the source electrode by a predetermined distance, and contacting an other side of the semiconductor active layer.

In some embodiments, the method further comprises: forming a passivation layer covering the data line, the source electrode, and the semiconductor active layer, and including a pixel contact hole exposing portions of the drain electrode; and forming a pixel electrode contacting the drain electrode through the pixel contact hole, on the passivation layer.

In some embodiments, the method further comprises, before forming the pixel electrode, forming a color filter, on the passivation layer, filling a pixel area surrounded by the gate line and the data line, and covering areas corresponding to the thin film transistor including the semiconductor active layer; and forming an overcoat layer covering the color filter layer.

In some embodiments, the gate line includes a copper material.

In some embodiments, the data line, the source electrode and the drain electrode are formed by depositing a protective layer having molybdenum and a low resistance layer having copper sequentially and patterning the protective layer and the low resistance layer.

In some embodiments, the protective layer including the molybdenum is patterned by a dry-etching process.

According to the present disclosure, the gate electrode material, the gate insulating material and the metal oxide semiconductor material are deposited on the surface of the substrate, a thermal treatment is conducted in a high temperature condition, and the gate electrode and the active layer are patterned. Therefore, it is possible to enhance the characteristics of the metal oxide semiconductor channel (active) layer. According to the present disclosure, the thin film transistor substrate does not require formation of an etch-stopper for protecting the semiconductor channel layer. However, in embodiments that include the etch-stopper, the etch-stopper can be formed using the pattern of the intermediate insulating layer disposed between the gate line and the data line, and an additional photo-lithography step is not required. As a result, it is possible to manufacture the thin film transistor substrate having enhanced characteristics and high stability using less number of photo mask process.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
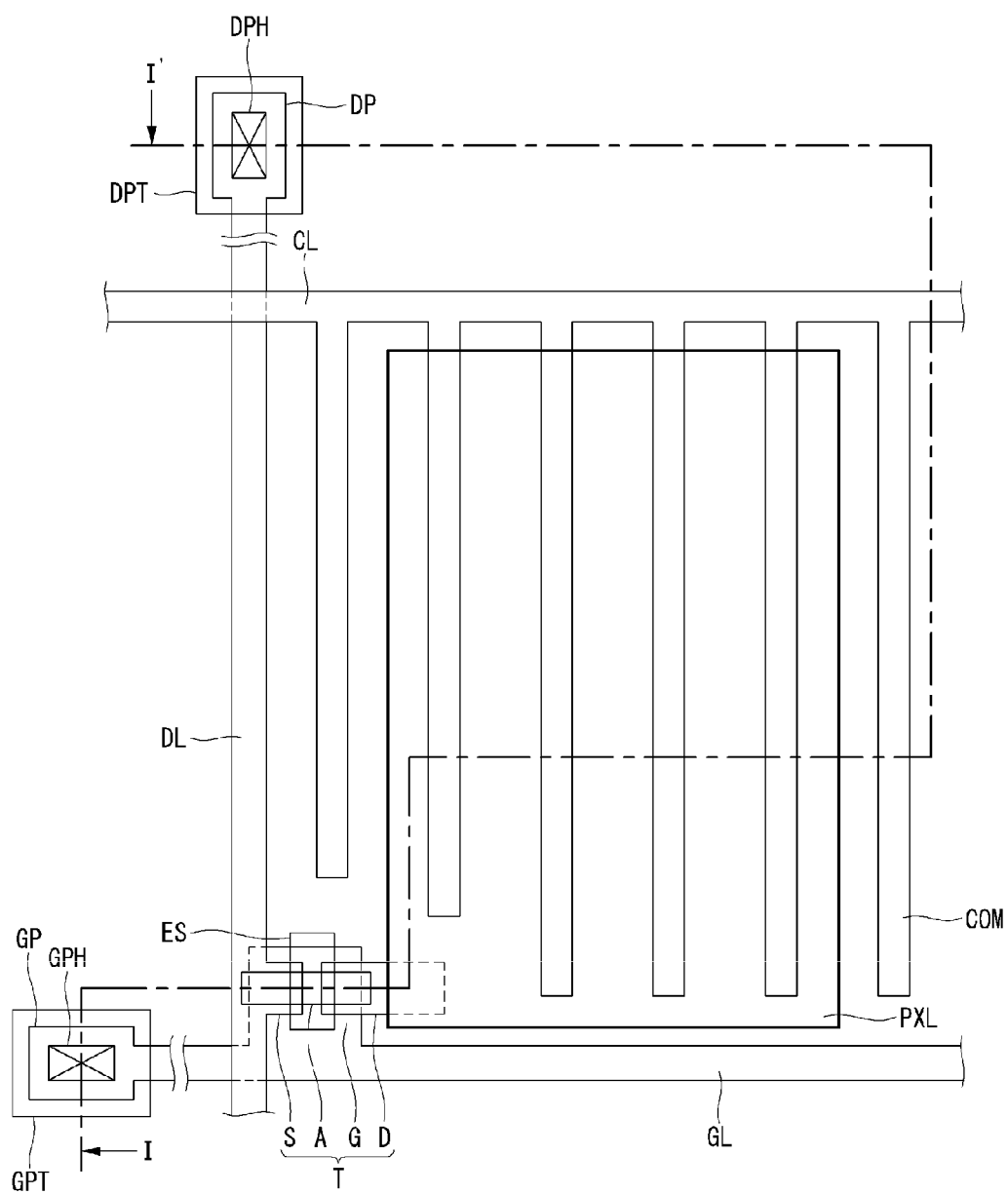
FIG. 1 is a plane view illustrating a thin film transistor substrate having a oxide semiconductor layer included in a fringe field type liquid crystal display according to the related art.
Figure 2:
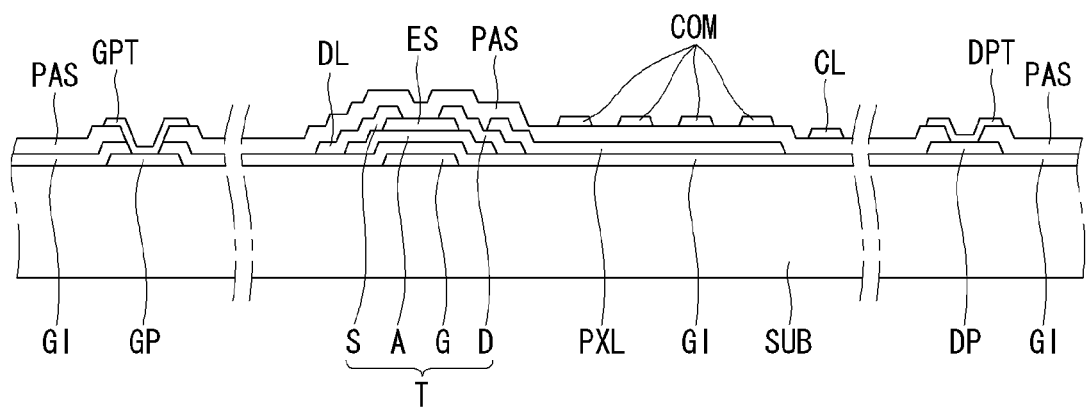
FIG. 2 is a cross-sectional view illustrating the structure of the thin film transistor substrate of FIG. 1 along the line I-I' according to the related art.

Referring to attached figures, preferred embodiments of the present disclosure will be described. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

Figure 3:
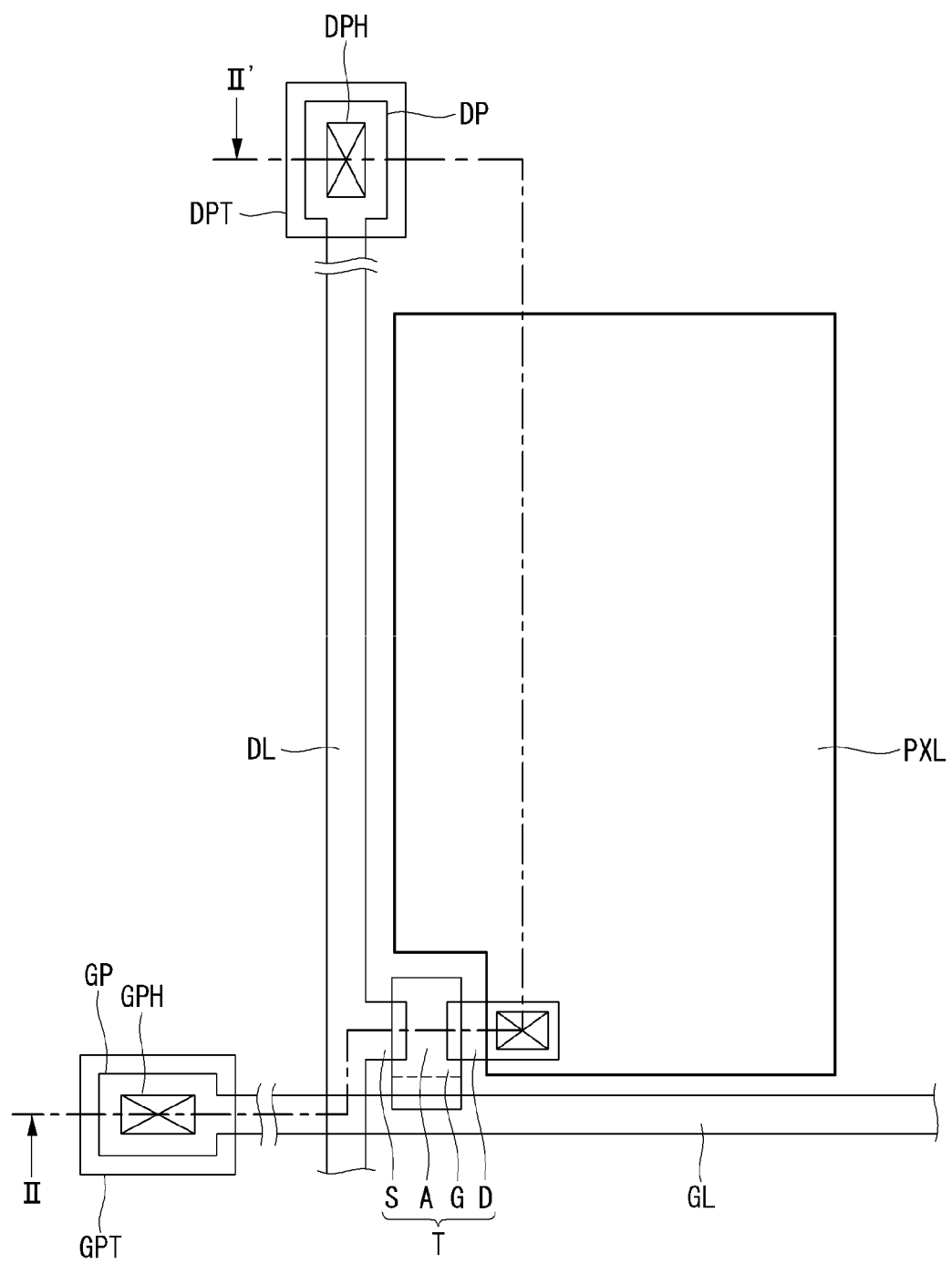
FIG. 3 is a plane view illustrating the structure of a thin film transistor substrate having a metal oxide semiconductor material according to the present disclosure.

Referring to attached figures including FIG. 3 and FIGS. 4A to 4G, a method for manufacturing a thin film transistor substrate having a metal oxide semiconductor material will be described according to a first embodiment of the present disclosure. FIG. 3 is a plane view illustrating the structure of a thin film transistor substrate having a metal oxide semiconductor material according to the present disclosure. FIGS. 4A to 4G are cross-sectional views illustrating method steps for manufacturing a thin film transistor substrate for a liquid crystal display having a metal oxide semiconductor material according to the first embodiment of the present disclosure, by cutting along to the line II-IF in FIG. 3.

At first, referring to FIGS. 3 and 4G, the thin film transistor substrate for the liquid crystal display will be described according to the first embodiment of the present disclosure. The liquid crystal display can be divided into the vertical electric field type and the horizontal electric field type, according to the disposing relationship of the pixel and the common electrodes. The present disclosure suggests a thin film transistor substrate which can be applied to these both types. Therefore, in FIG. 3, the common electrode is not shown, and the structure of the common electrode COM will be explained separately.

The thin film transistor substrate having a metal oxide semiconductor according to the first embodiment of the present disclosure comprises a pixel area defined by the crossing structure of a gate line GL running to the horizontal direction on the substrate SUB and a data line DL running to the vertical direction. At one corner of the pixel area, a thin film transistor T is disposed. Almost portions of the pixel area are occupied by a pixel electrode PXL driven by the thin film transistor T. The thin film transistor T comprises a gate electrode G, a semiconductor active layer A overlapping with the gate electrode G on a gate insulating layer GI, a source electrode S contacting one side of the active layer A, and a drain electrode D facing to the source electrode S and contacting the other side of the active layer A.

The gate line GL has a gate pad GP disposed at one end of the gate line GL, and connects to the gate electrode G of the thin film transistor T. Especially, some portions of the gate electrode G exposed by eliminating some portions of the gate insulating layer GI are contacted the gate line GL to form an electric connection between the gate line GL and the gate electrode G. The data line DL has a data pad DP disposed at one end of the data line DL, and connects to the source electrode S of the thin film transistor T. Especially, the source electrode S is directly branched from the data line DL.

Hereinafter, further referring to FIGS. 4A to 4G, a method for manufacturing the thin film transistor substrate having the metal oxide semiconductor will be described according to the first embodiment of the present disclosure.

Figure 4A:
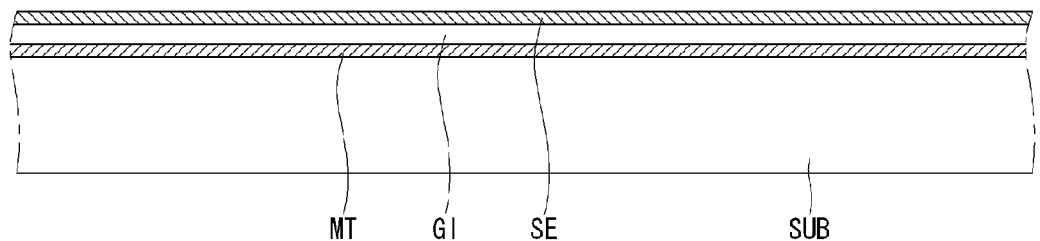
FIGS. 4A to 4G are cross-sectional views along the line II-IF in FIG. 3 illustrating method steps for manufacturing a thin film transistor substrate for a liquid crystal display having a metal oxide semiconductor material according to a first embodiment of the present disclosure.

As shown in FIG. 4A, on a transparent substrate SUB, a metal layer MT for the gate electrode G, a gate insulating layer GI, and a metal oxide semiconductor layer SE are sequentially deposited. It is preferable for the gate insulating layer GI to be made of the silicon oxide (SiOx) which makes less amount of hydrogen ion or hydrogen material during manufacturing process. The metal oxide semiconductor layer SE may include the IGZO (or Indium Gallium Zinc Oxide) or the ITZO (Indium Tin Zinc Oxide). After three layers are sequentially deposited on the substrate SUB, a thermal treatment is conducted at 300° C. or higher temperature condition. As a result, the physical characteristics of the metal oxide semiconductor layer SE can be stabilized and the high reliability of it can be ensured.

Patterning the sequentially deposited layers including the metal layer MT for the gate electrode G, the gate insulating layer GI and the metal oxide semiconductor layer SE by the first mask process, the gate electrode G and the semiconductor active layer A are formed. Between the gate electrode G and the semiconductor active layer A, the gate insulating layer GI is sandwiched. Here, one side of the gate electrode G is exposed for connecting to the gate line G. Therefore, some portions of the gate insulating layer GI and the metal oxide semiconductor layer SE over the one side of the gate electrode G should be selectively removed. To do so, in the first mask process, the photo mask may be the half-tone mask. In detail, the gate electrode G is formed in a rectangular shape, the gate insulating layer GI is formed to have the similar shape as the gate electrode G wherein the gate insulating layer GI covers most portions of the gate electrode G except some end portions. Further, the semiconductor active layer A may have the same shape as the gate insulating layer GI.

Figure 4B:
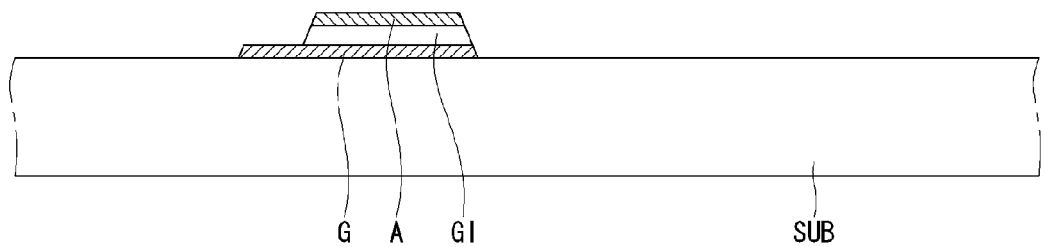
Figure 4C:
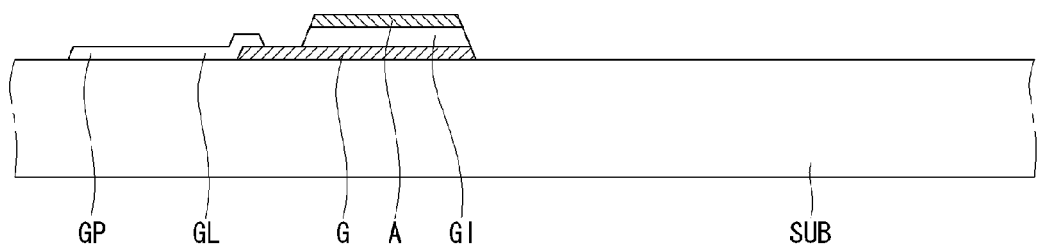

As the thermal treatment is conducted with the metal layer MT for the gate electrode G and the metal oxide semiconductor layer SE deposited over all surface of the substrate SUB before forming the gate electrode G, the thermal stress distribution over the substrate SUB is uniformed so that the substrate SUB can be maintained in plane condition. If the thermal treatment for stabilization of the active layer A is conducted after patterning the gate electrode G and the active layer A as shown in FIG. 4B, the substrate SUB may be deformed, distorted, bent or damaged because the metal material, the gate electrode G is not uniformly distributed over the substrate SUB.

On the substrate SUB having the gate electrode G and the semiconductor active layer A, the metal layer for the gate line GL is deposited. As shown in FIG. 4B, patterning the metal layer by the second mask process, the gate line GL running to the horizontal direction on the substrate SUB to connect the gate electrode G is formed. Further, at the one end of the gate line GL, a gate pad GP is formed. The metal layer for the gate line GL may include the copper (Cu) or the copper alloy. For example, the metal layer for the gate line GL can be made of the double layered metal material such as Cu/Mo—Ti (copper/molybdenum-titanium), Cu-alloy/Mo (copper alloy/molybdenum), or Cu-alloy/Mo—Ti (copper alloy/molybdenum-titanium). Otherwise, it can be made of the triple layered metal material such as Mo/Cu/Mo (molybdenum/copper/molybdenum), Mo—Ti/Cu/Mo—Ti (molybdenum-titanium/copper/molybdenum-titanium), or Mo—Ti/Cu-alloy/Mo—Ti (molybdenum-titanium/copper alloy/molybdenum-titanium).

The copper material can be weak under the high temperature treatment condition. Therefore, after depositing/forming the metal layer for gate line GL, it is preferable not to expose under the high temperature processing conditions over 400° C. In the present disclosure, the gate line GL is deposited/formed after conducting the thermal treatment for the gate electrode G and the active layer A so that the stability of the copper material included in the gate line GL can be ensured.

Figure 4D:
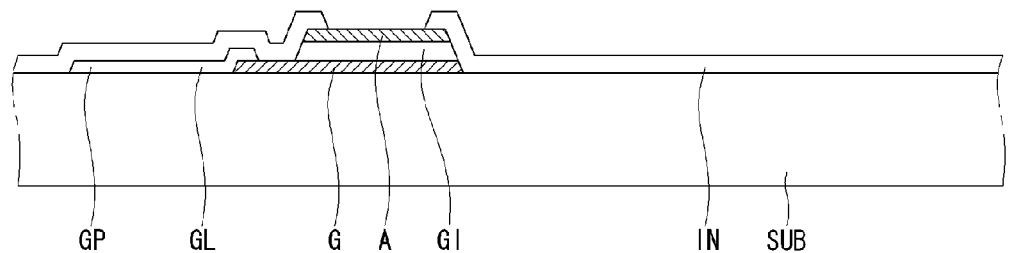

On the substrate SUB having the gate line GL and the gate pad GP, an intermediate insulating layer IN is formed by depositing the silicon oxide (SiOx). Using the third mask process, as shown in FIG. 4D, patterning the intermediate insulating layer IN, some portions (especially, the middle portions) of the upper surface of the semiconductor active layer A are exposed to contact with the source-drain electrodes S and D. As the semiconductor layer A has been stabilized and the reliability has been enhanced by the thermal treatment conducted at the process shown in FIG. 4A, the stability and reliability of the semiconductor layer A would not be degraded even if it is exposed by this patterning process. Even though not shown in figures, if required, on the actual channel area excepting the areas contacting with the source-drain electrodes S and D, the intermediate insulating layer IN may be remained to protect the channel area of the active layer A more strongly.

Figure 4E:
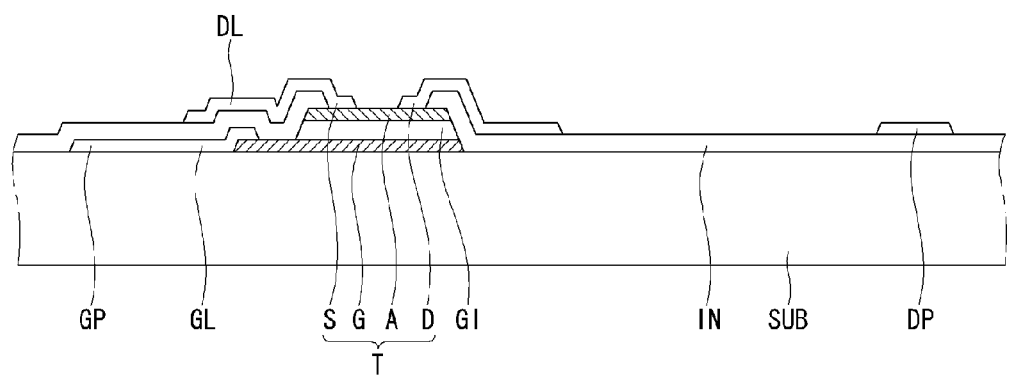

With the intermediate insulating layer IN exposing the surface of the channel layer A, a source-drain metal layer is deposited on the substrate SUB. Patterning the source-drain metal layer by the fourth mask process, a data line DL running to the vertical direction on the substrate SUB, a source electrode S branching from the data line DL and contacting one side of the semiconductor active layer A, and a drain electrode D facing the source electrode S apart from it and contacting the other side of the semiconductor active layer A are formed. Further, at one end of the data line DL, the data pad DP is formed. Consequently, the thin film transistor T having the metal oxide semiconductor material is completed, as shown in FIG. 4E.

The source-drain metal layer may have a double layer or triple layer structure in which protective layers including molybdenum (Mo) or molybdenum-titanium (Mo—Ti) and the low resistance layer including copper are alternatively stacked in two layers or three layers. For example, the source-drain metal layer may have a triple layer structure including Mo—Ti/Cu/Mo—Ti or the double layer structure including Cu/Mo—Ti. With this structure in which the protective layer including molybdenum is contacting with the metal oxide semiconductor active layer A, when patterning the source-drain metal layer, the protective layer would be patterned by a dry etching method. By the thermal treatment in FIG. 4A, the stability and reliability are enhanced. In addition, by using the dry-etching method for patterning the source-drain electrodes, the semiconductor active layer A can be protected in stabilized and reliable conditions. That is, using the dry-etching process which makes less effect on the stability and reliability of the active layer A, it is possible to keep the characteristics of the semiconductor active layer A without an etch-stopper.

Figure 4F:
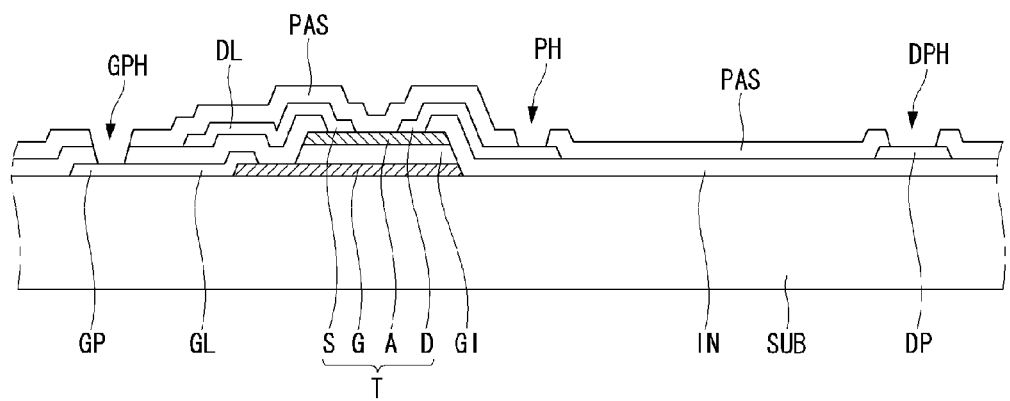

On the whole surface of the substrate SUB having the thin film transistor T, depositing the silicon oxide (SiOx), a passivation layer PAS is formed. Patterning the passivation layer PAS by the fifth mask process, a pixel contact hole PH exposing some portions of the drain electrode D is formed. At the same time, a data pad contact hole DPH exposing the data pad DP is formed. Further, continuously patterning the passivation layer PAS and the intermediate insulating layer IN, a gate pad contact hole GPH exposing the gate pad GP is formed, as shown in FIG. 4F.

On the substrate SUB having the contact holes PH, GPH and DPH, a transparent conductive material including the ITO (Indium Tin Oxide) or IZO (Indium Zinc Oxide) is deposited. Patterning the transparent conductive material by the sixth mask process, a pixel electrode PXL contacting the drain electrode D through the pixel contact hole PH and occupying most portions of the pixel area. Further, a gate pad terminal GPT contacting the gate pad GP through the gate pad contact hole GPH and a data pad terminal DPT contacting the data pad DP through the data pad contact hole DPH are formed, as shown in FIG. 4G.

Figure 4G:
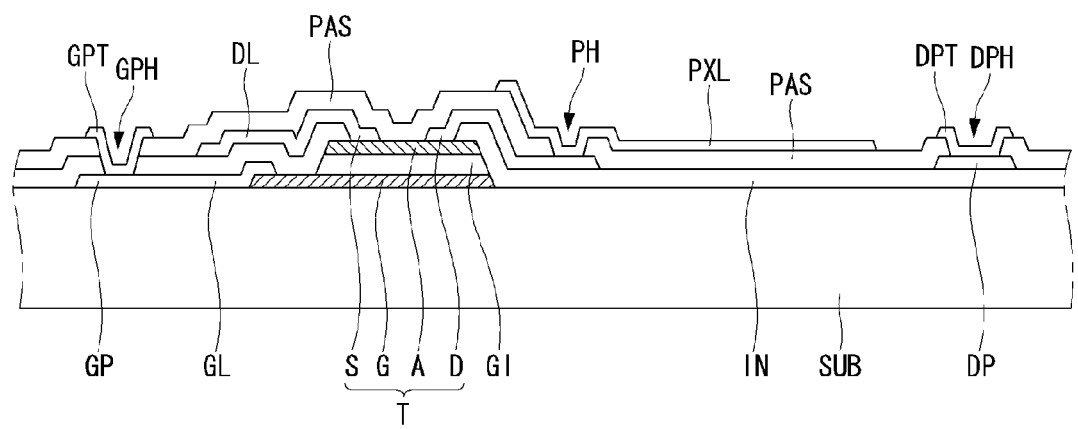

Even though not shown in figures, for the case of the vertical electric field LCD, a common electrode is further formed on the upper substrate facing the thin film transistor substrate shown in FIG. 4G with the liquid crystal layer there-between. On the contrary, for the case of the horizontal electric field LCD, a second passivation layer is further formed on the substrate SUB having the pixel electrode PXL, and a common electrode is further formed on the second passivation layer.

Figure 5A:
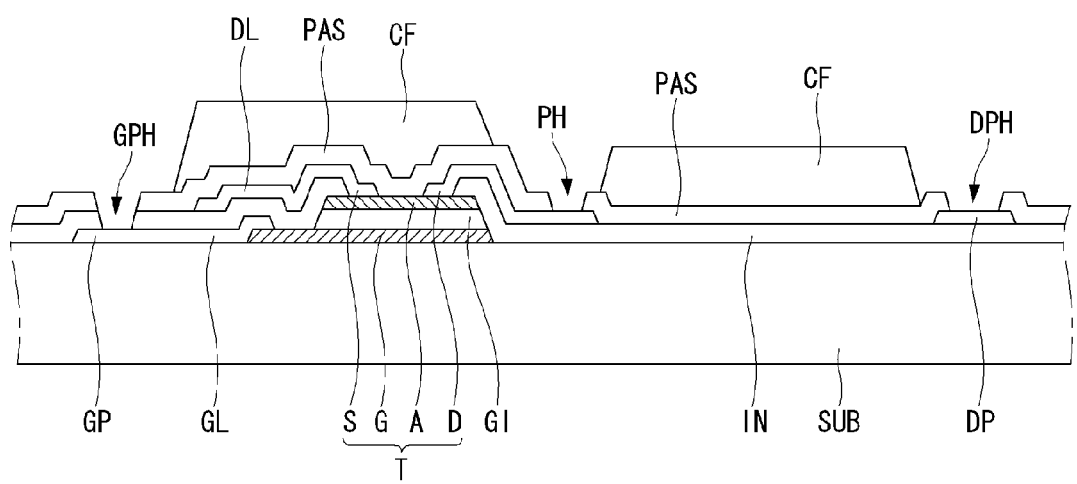
FIGS. 5A and 5C are cross-sectional views along the line II-IF in FIG. 3 illustrating method steps for manufacturing a thin film transistor substrate for an organic light emitting display having a metal oxide semiconductor material according to a second embodiment of the present disclosure.
Figure 5B:
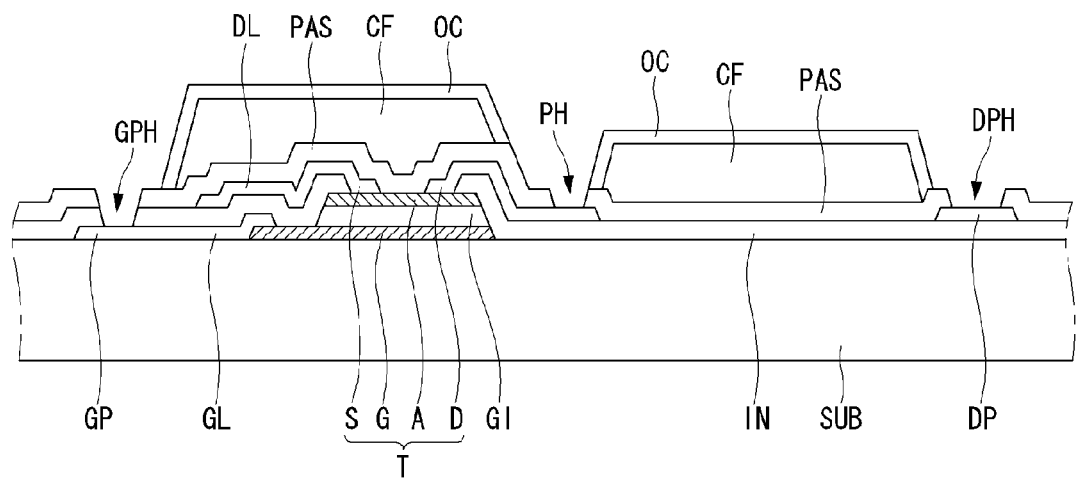
Figure 5C:
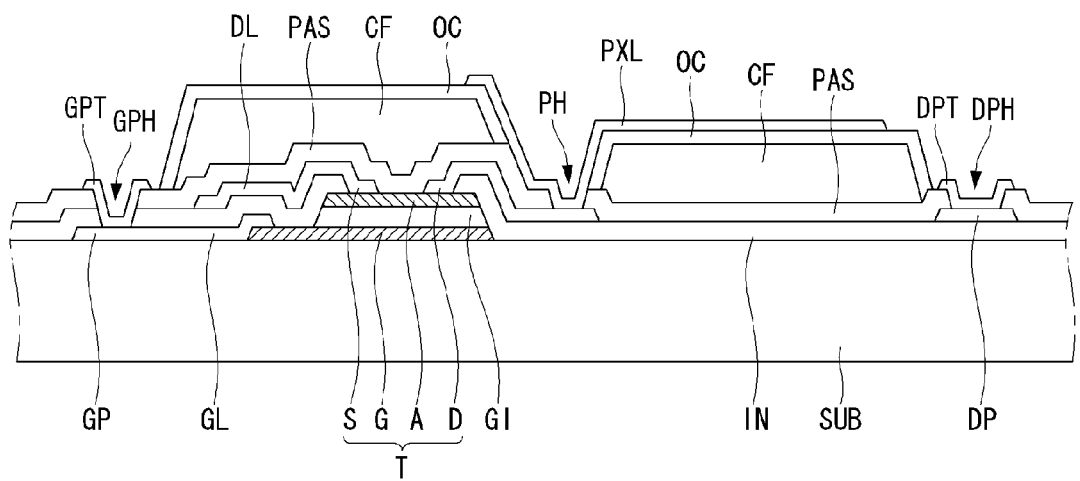

The first embodiment of the present disclosure explains a method for manufacturing a thin film transistor substrate having the metal oxide semiconductor material. The concept of the present disclosure can be applied to a thin film transistor substrate for the organic light emitting diode display. In that case, the manufacturing method is like the method mentioned in the first embodiment. Hereinafter, further referring to FIG. 4F and FIGS. 5A to 5C, we will explain about the method for manufacturing the thin film transistor substrate according to the second embodiment of the present disclosure. FIGS. 5A and 5C are cross-sectional views illustrating method steps for manufacturing a thin film transistor substrate for an organic light emitting display having a metal oxide semiconductor material according to the second embodiment of the present disclosure, by cutting along to the line II-II' in FIG. 3.

As shown in FIG. 4F, the passivation layer PAS covering the thin film transistor T is formed. Patterning the passivation layer PAS by the fifth mask process, the contact holes (i.e., the pixel contact hole PH, the gate pad contact hole GPH and the data pad contact hole DPH) are formed exposing the drain electrode D, the gate pad GP and the data pad DP, respectively.

Depositing pigment layer on the passivation layer PAS, and patterning the pigment layer by the sixth mask process, a color filter CF is formed. It is preferable that the color filter CF occupies the most areas of the pixel area defined by the crossing structure of the gate line GL and the data line DL. Furthermore, by remaining the color filter CF on the thin film transistor T, it is possible to protect the thin film transistor T from light incident from the external environment. With this structure, the stability and the reliability of the semiconductor active layer A can be further ensured. At every pixel area, one color pigment of red, green and blue is disposed to form a color filter CF. Therefore, in order to complete the color filter CF, at least three mask processes can be sequentially conducted, as shown in FIG. 5A.

In order to reduce the number of mask processes, when patterning the color filter CF, the passivation layer PAS is simultaneously patterned for forming the contact holes PH, GPH and DPH. However, when the color filter CF is much thicker than the passivation layer PAS, it may be hard to pattern the color filter CF and the passivation layer PAS at the same time. In that case, at first patterning the passivation layer PAS, the contact holes PH, GPH and DPH are formed, after that, the areas corresponding to the contact holes PH, GPH and DPH are opened when patterning the color filter CF.

On the substrate SUB having the color filter CF, an overcoat material is deposited. Patterning the overcoat material by the seventh mask process, an overcoat layer OC having the openings exposing the contact holes PH, GPH and DPH is formed, as shown in FIG. 5B.

On the substrate SUB having the overcoat layer OC, a transparent conductive material such as ITO (Indium Tin Oxide) or IZO (Indium Zinc Oxide) is deposited. Patterning the transparent conductive material by the eighth mask process, a pixel electrode PXL contacting the drain electrode D through the pixel contact hole PH and occupying the most areas of the pixel area is formed. Further, a gate pad terminal GPT contacting the gate pad GP through the gate pad contact hole GPH and a data pad terminal DPT contacting the data pad GP through the data pad contact hole DPH are formed, as shown in FIG. 5C.

After that, even though not shown in figures, by forming a bank layer and stacking an organic light emitting layer and a second electrode layer, the organic light emitting diode display can be completed.

As mentioned above, in the present disclosure, the gate electrode material, the gate insulating material and the metal oxide semiconductor material are sequentially deposited on the whole surface of the substrate, the thermal treatment is conducted, and then the gate electrode and the semiconductor active layer are formed. Therefore, the characteristics of the semiconductor material can be enhanced and the reliability of it can be strongly ensured.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A thin film transistor substrate, comprising:
   a gate electrode formed on a substrate;
   a gate insulating layer covering first portions of the gate electrode and exposing second portions of the gate electrode;
   a flat semiconductor active layer overlapping with the first portions of the gate electrode on the gate insulating layer;
   a passivation layer directly contacting the flat semiconductor active layer;
   a gate line contacting the second portions of the gate electrode and running in a horizontal direction on the substrate;
   an intermediate insulating layer exposing middle portions of the flat semiconductor active layer and covering the gate line and the gate electrode;
   a data line running in a vertical direction on the substrate on the intermediate insulating layer;
   a source electrode branching from the data line and contacting a side of the flat semiconductor active layer; and
   a drain electrode facing the source electrode, separated by a predetermined distance from the source electrode, and contacting another side of the flat semiconductor active layer.

2. The thin film transistor substrate according to claim 1, further comprising:
   a pixel contact hole exposing portions of the drain electrode by penetrating the passivation layer; and
   a pixel electrode contacting the drain electrode through the pixel contact hole.

3. The thin film transistor substrate according to claim 2, further comprising:
   a color filter layer disposed on the passivation layer and under the pixel electrode; and
   an overcoat layer disposed under the pixel electrode and covering the color filter layer.

4. The thin film transistor substrate according to claim 3, wherein the color filter layer is filled with the inside area of a pixel area surrounded by the gate line and the data line, and is covering areas corresponding to the thin film transistor including the flat semiconductor active layer.

5. The thin film transistor substrate according to claim 1, wherein the gate line includes a copper material.

6. The thin film transistor substrate according to claim 1, wherein the data line includes a low resistance layer having copper and a protective layer having molybdenum.

7. The thin film transistor substrate according to claim 1, wherein the passivation layer covers the source electrode and the drain electrode.

* * * * *